310-334 SR

7/8/80 XR 4,211,950

United States Patent [19]

Roos

[11] 4,211,950

[45] Jul. 8, 1980

[54] ARRANGEMENT FOR COUPLING RF ENERGY INTO PIEZOELECTRIC TRANSDUCERS

[75] Inventor: Edward V. Roos, Cocoa Beach, Fla.

[73] Assignee: Harris Corporation, Cleveland, Ohio

[21] Appl. No.: 941,910

[22] Filed: Sep. 13, 1978

[51] Int. Cl.[2] .............................................. H01L 41/10

[52] U.S. Cl. .................................... 310/327; 310/341; 310/364; 310/334

[58] Field of Search ............... 310/322, 323, 327, 341, 310/346, 363, 364, 334

[56] References Cited

U.S. PATENT DOCUMENTS

| | | | |
|---|---|---|---|
| 1,875,953 | 9/1932 | Taylor | 310/341 |
| 2,106,143 | 1/1938 | Williams | 310/363 |
| 2,283,285 | 5/1942 | Pohlman | 310/327 X |
| 2,728,869 | 12/1955 | Pohlman | 310/327 X |
| 2,736,823 | 2/1956 | Sheppard et al. | 310/327 |
| 3,794,866 | 2/1974 | McElroy et al. | 310/327 |
| 3,925,692 | 12/1975 | Leschek et al. | 310/327 |
| 3,935,484 | 1/1976 | Leschek et al. | 310/327 |

*Primary Examiner*—Mark O. Budd

*Attorney, Agent, or Firm*—Craig & Antonelli

[57] ABSTRACT

For coupling RF energy into a piezoelectric transducer, a sheet of conductive foil is held in pressure contact with substantially the entire surface of a transducer electrode. A heat sink is thermally coupled to the sheet of conductive foil through a layer of material that is electrically insulative and also effectively thermally conductive so as to draw heat away from the transducer. Moreover, this layer of material that is interposed between the heat sink and the sheet of conductive foil has the property of creating an acoustic impedance mismatch between the transducer and the heat sink, so that acoustic waves that are launched by the transducer will not be transmitted into the heat sink, but will be confined to the intended medium of acoustic propagation upon which the transducer is mounted.

14 Claims, 3 Drawing Figures

ARRANGEMENT FOR COUPLING RF ENERGY INTO PIEZOELECTRIC TRANSDUCERS

FIELD OF THE INVENTION

The present invention relates in general to energy coupling devices and is particularly directed to a scheme for efficiently coupling RF energy into a piezoelectric transducer, such as one that may be employed for launching an acoustic wave into an acoustic-optic cell, while at the same time providing efficient thermal transfer away from the transducer through the coupler, thereby preventing damage to the region where the electrode is bonded to the transducer, without undesirably reducing the transfer of acoustic energy into the acoustic-optic cell.

BACKGROUND OF THE INVENTION

Piezoelectric transducers have been commonly employed in various environments where energy conversion is required. These include electromechanical conversion systems such as measuring and testing equipment, electro-optical conversion systems such as optical modulators, etc. A practical application of piezoelectric transducers to electro-optical systems has involved the area of optical shutter controls such as are employed in laser modulators, Q-switches, etc. Typically, an electrical signal input is applied to a piezoelectric transducer through a coupling electrode bonded to the surface of the transducer, causing the transducer to launch a light beam-modifying acoustic wave into the medium upon which the transducer is mounted. In optical communication systems to which radio frequency (RF) signals may be coupled, the coupling of the RF signals to the transducer has been conventionally effected by way of a signal transmission wire soldered to the transducer electrode that is bonded to the surface of the transducer. Unfortunately, because of the extreme thinness of the transducer electrode and the manner in which a transducer electrode is formed on the surface of the transducer, cracks or separations are liable to occur in the electrode when the electrode is subjected to a high frequency (RF) input signal. A discussion of the bonding properties and characteristics of piezoelectric transducers may be found in an article by E. V. Sittig et al entitled "Bonded Piezoelectric Transducers for Frequencies Beyond 100 MHz", published in Ultrasonics, April 1969, pages 108–112, and in an article by A. H. Mietzler et al entitled "Characterization of Piezoelectric Transducers Used in Ultrasonic Devices Operating Above 0.1 GHz", published in the Journal of Physics Letters, Vol. 40, No. 11, October 1969, pages 4341–4352. Since the coupling of electrical energy between the signal transmission wire and the transducer electrode is conventionally effected by way of a solder joint over a relatively small area, destruction or deterioration of the bond between the electrode and the transducer is prone to occur because of severe localized heating created by the combination of the solder connection and the cracks or separations in the electrode which reduce the intended distribution of the electric field from the overall area of the electrode to a concentrated application of the electric field in that segment of the electrode to which the signal wire is soldered. In addition, a reduction in the electric field distribution area at the surface of the transducer electrode means that there is a corresponding reduction in the degree of application of the acoustic wave launched by the transducer into the acoustic-optic medium.

In an effort to reduce the undesirable heating effects at the transducer electrode, a heat sink may be coupled to the area of contact of the solder joint between the signal transmission wire and the transducer electrode. However, the coupling of the heat sink to the region of the transducer electrode at the signal transmission wire solder joint is such that some of the acoustic energy that is intended to be propagated from the transducer into the acoustic-optic medium is, instead, coupled into the heat sink and propagated away from the acoustic-optic medium.

SUMMARY OF THE INVENTION

In accordance with the present invention, the above-described drawbacks of a conventional solder connection between a signal transmission wire and the transducer electrode are obviated by an energy coupling scheme that provides a maximum degree of energy coupling and electrical field distribution between the entire area of the transducer electrode and the piezoelectric transducer. Moreover, a thermal transfer arrangement is coupled to the energy coupling scheme that efficiently removes heat from the area of the transducer electrode while it effectively impedes the transfer of acoustic energy away from the acoustic transmission medium, thereby improving the overall intended energy coupling efficiency of the device.

For this purpose, in place of the conventional solder joint connection, the energy coupling scheme of the present invention comprises a sheet of conductive foil held in pressure contact with substantially the entire surface area of the transducer electrode, thereby considerably increasing the area of distribution of the electric field applied to the transducer and correspondingly increasing the degree of application of acoustic energy into the acoustic propagation medium upon which the transducer is mounted. In addition, between a heat sink provided for removing thermal energy away from the transducer electrode and the sheet of conductive foil, there is provided a layer of material that effectively permits the transfer of thermal energy between the transducer electrode and the heat sink while impeding the transfer of both electrical energy and acoustic energy away from the transducer. By the dual combination of the sheet of conductive foil and the layer of material that has the above-described energy transfer properties, there is provided an energy coupling arrangement that overcomes the localized heating destruction drawbacks of the prior art and, in addition, substantially increases the acoustic and electrical energy coupling efficiency of the device.

DETAILED DESCRIPTION

Figure 1:
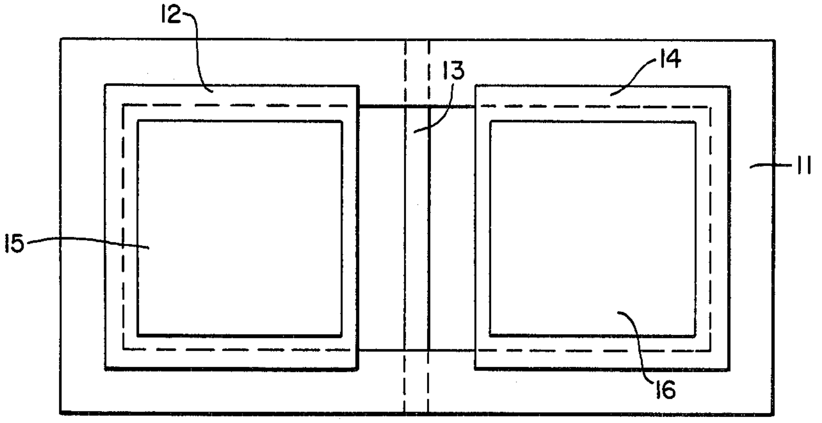
FIG. 1 is a front view of an acoustic-optic cell upon which are mounted a pair of separated piezoelectric transducers having respective electrodes and a common ground plane electrode.
Figure 2:
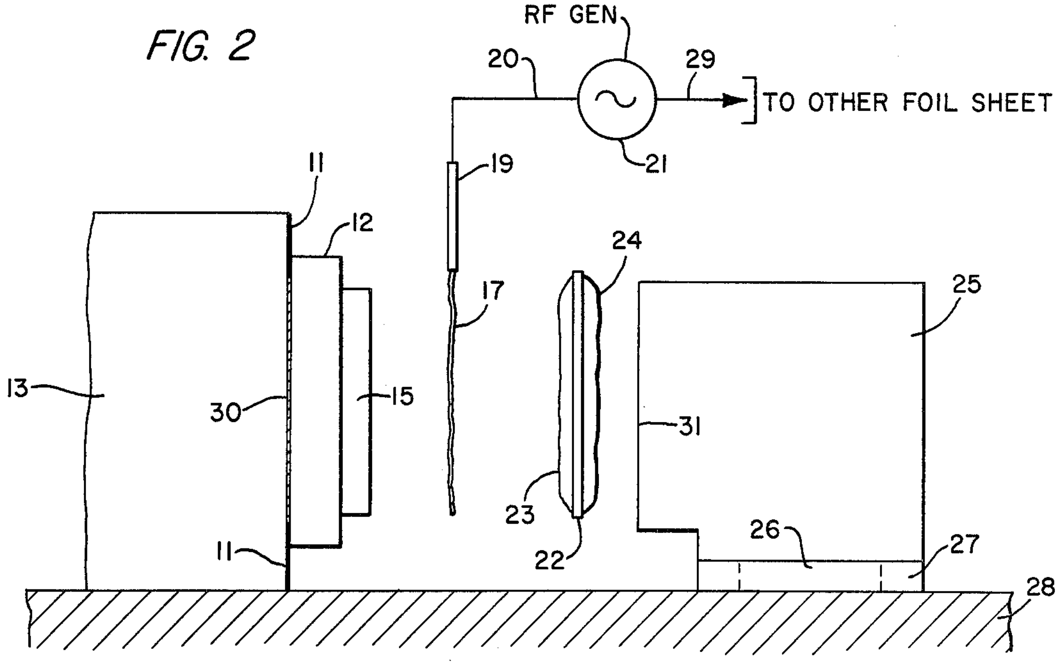
FIG. 2 is a partially exploded side view of the acoustic-optic cell-transducer configuration shown in FIG. 1 together with an energy coupling arrangement in accordance with the present invention.
Figure 3:
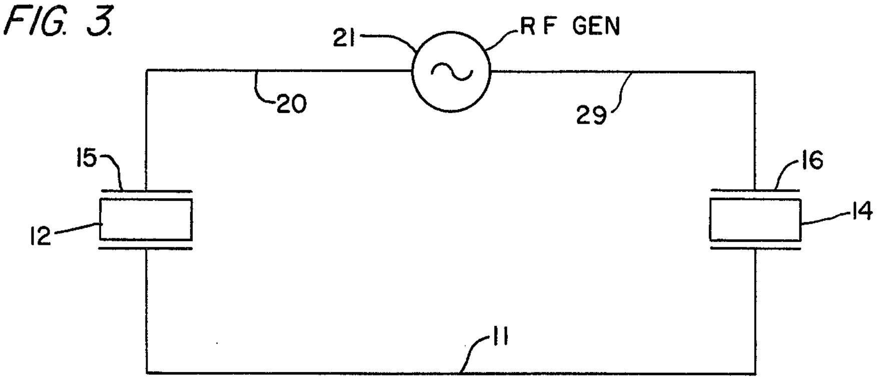
FIG. 3 is a schematic illustration of the transducer-energy coupling configuration shown in FIGS. 1 and 2.

Referring now to FIGS. 1 through 3 of the drawings, there are illustrated various views of a preferred embodiment of the present invention. All of the various components of the invention may be suitably mounted on a rigid base frame, such as an anodized aluminum mounting plate 28, for providing rigidity to the overall assembly. An acoustic-optic medium 13 such as a standard quartz cell into which acoustic waves are to be launched is mounted on base 28, with a suitable transducer arrangement being affixed to one face 30 thereof. In an exemplary embodiment of the invention shown in FIGS. 1 through 3, the transducer arrangement comprises a pair of lithium niobate piezoelectric transducer chips 12 and 14 obtained by cutting a single chip in half and rotating one of the chips 180° so that the initial polarization directions of the chips are reversed relative to one another when the chips are laid in a common plane. With this orientation, transducers 12 and 14 are bonded to separate portions of the surface 30 of acoustic-optic cell 13 with their outer edge portions lying in contact with a circumferential electrode 11 that is also affixed to the perimeter of face 30 of cell 13. Electrode 11 may be formed of a thin layer of chromium-gold alloy that effectively forms a ground plane for electrically connecting the same side of each of transducers 12 and 14 together.

On the opposite face of each of the transducers 12 and 14, there is formed a respective electrode 15 and 16 across which an RF input signal from a suitable source 21 is to be applied. As was described briefly above, in accordance with the present invention, the connection of the RF input signal to the transducer electrode is carried out by using a thin sheet of conductive foil which has an area approximately equal to that of the transducer electrode, rather than a small solder connection as in the prior art. One of the sheets of conductive foil 17 is illustrated in FIG. 2 as being attached via a foil lead 19 and then to a lead wire 20 to one terminal of RF signal source 21. The other terminal of RF signal source 21 is connected by way of a separate foil lead and lead wire to a separate sheet of conductive foil (not shown) that has a contact area approximately that of the other electrode 16 of transducer 14. The conductive foils that are to be held in pressure contact with transducer electrodes 15 and 16, once the device has been assembled, may comprise thin copper foil strips on the order of 5 mils in thickness. Because of the large area, relative to the area of a transducer electrode, of the conductive foil in contact therewith, the RF field applied to the surface of the transducer is uniformly and homogeneously distributed across the face of the transducer, to maximize the intended distribution of the acoustic wave launched into acoustic-optic medium 13 by transducers 12 and 14.

In order to efficiently remove heat generated at transducers 12 and 14 by the application of the RF field, a heat sink block 25 that is to be mounted upon base 28 is provided. The bottom 27 of heat sink block 25 may extend outwardly from the upper portion thereof to permit the heat sink block to be affixed to base 28 by suitable screws that pass through slots, such as at 26 shown in FIG. 2, and engage tapped holes in base 28. The length of the slots permits relative play along base 28 until the screws are tightly secured. The size and shape of face 31 of heat sink block 25 are such as to accomodate the areas of the sheets of copper foil. Between each sheet of foil and face 31 of heat sink block 25, there is disposed a thin layer of electrically insulative material 22. Ideally, material 22 is one that is electrically insulating, thermally conductive, and offers a good acoustic impedance mismatch between the transducer electrode assembly and the heat sink block 25. Both Mylar and beryllium oxide have been found to be suitable materials in this respect. Where Mylar is used as layer 22, the opposite sides of layer 22 may be coated with a suitable heat conductive grease, such as Dow Corning heat sink grease, in order to maximize the transfer of heat away from the transducer electrodes to the heat sink block 25, the Mylar layer 22 being sufficiently thin to conduct heat to block 25, while still electrically insulating the two adjacent strips of copper foil from each other and from block 25.

Once the components of the energy coupling configuration described above have been arranged relative to one another in the manner shown and described herein, they are pressed together with the face 31 of heat sink block 25 being urged toward the transducer electrodes and firmly affixed to base 28, such as by way of suitable screws inserted through the slots 26 in the lower projecting portions of block 25 and engaging tapped holes in base 28, for example.

With the components pressed together in their assembled condition, the application of RF energy from signal source 21 to the respective copper foils that are pressed against electrodes 15 and 16 results in a broad coupling of the RF energy over the faces of transducers 12 and 14, thereby assuring that the acoustic waves that are launched into acoustic-optic cell 13 will be properly distributed as intended. The thermal transfer properties of the layer 22 and heat sink block 25 cause heat to be removed away from the electrodes and thereby improve both the operation and lift of the transducer assembly. Finally, because of the acoustic impedance mismatch provided by layer 22 at the face 31 of the heat sink block, there is very little coupling of acoustic energy from the transducers in a direction opposite to the intended launching direction into the acoustic-optic cell 13. It will be readily appreciated therefore, that the present invention obviates the drawbacks suffered by the prior art energy coupling configurations described previously, so that it offers a significant improvement over previously proposed coupling assemblies through which an acoustic-optic cell was subjected to deterioration and destruction created by localized heating effects. Thus, the present invention has direct advantageous applications to the field of optical modulation systems, wherein high frequency, high energy light beam switching is effected.

In the foregoing embodiment of the invention, the configuration of the transducer assembly has been described as comprising a pair of transducers and associated electrodes disposed adjacent to one another on the surface of the acoustic-optic medium into which acoustic waves are to be launched. It should be realized, however, that the invention is not so limited, but may comprise a number of transducers and associated electrodes greater or lesser than the pair of transducers described. For example, the present invention is applicable to an implementation involving only a single transducer, wherein one terminal of the signal source is connected to the sheet of conductive foil and the other terminal connected to the other transducer electrode which, like ground plane electrode 11, is disposed on the surface of the transducer opposite that to which the first electrode is bonded. I therefore do not wish to be limited to the details shown and described herein, but intend to cover all such changes and modifications as are obvious to one of ordinary skill in the art.

I claim:

1. An arrangement for coupling energy into a transducer comprising:
 a transducer electrode disposed on a surface of said transducer by way of which electrical energy is applied to said transducer to cause said transducer to generate an output in accordance therewith;
 first means, coupled to said transducer electrode, for imparting to said electrode and electric field uniformly distributed over substantially the entire area of contact between said transducer electrode and said transducer;
 second means, coupled to said first means, for removing thermal energy away from said transducer; and
 third means, disposed between said first means and said second means, for electrically insulating said first means from said second means and thermally coupling said first means to said second means, while effectively impeding the transfer of the output of said transducer in the direction of the removal of thermal energy via said second means.

2. An arrangement according to claim 1, wherein said transducer is an electro-acoustic transducer that generates an acoustic wave as the output thereof in response to the application of electrical energy thereto.

3. An arrangement according to claim 2, wherein said electro-acoustic transducer is disposed on a surface of an acoustic energy transmission material into which acoustic waves are launched by said transducer in response to the application of electrical energy to said transducer by way of said transducer electrode.

4. An arrangement according to claim 2, wherein said second means comprises a heat sink element disposed in thermal communication with said transducer electrode and said third means is disposed between said heat sink element and said transducer electrode, for coupling thermal energy therethrough away from said transducer to said heat sink element while impeding the transfer of acoustic waves, generated by said transducer, into said heat sink element.

5. An arrangement according to claim 4, wherein said electro-acoustic transducer is disposed on a surface of an acoustic energy transmission material into which acoustic waves are launched by said transducer in response to the application of electrical energy to said transducer by way of said transducer electrode.

6. An arrangement according to claim 4, wherein said first means comprises a sheet of conductive material, the shape and size of which correspond substantially to those of said transducer electrode, disposed between said transducer electrode and said third means.

7. An arrangement according to claim 6, wherein said third means comprises a layer of electrical insulator material, disposed between said sheet of conductive material and said heat sink element, that has the property of transferring thermal energy therethrough while impeding the transfer of acoustic energy therethrough.

8. An arrangement according to claim 7, wherein said electro-acoustic transducer is disposed on a surface of an acoustic energy transmission material into which acoustic waves are launched by said transducer in response to the application of electrical energy to said transducer by way of said transducer energy.

9. An arrangement according to claim 7, wherein said layer of electrical insulator material comprises beryllium oxide.

10. An arrangement according to claim 7, wherein said layer of electrical insulator material comprises Mylar.

11. An arrangement according to claim 7, further comprising respective layers of heat conductive material coated on opposite sides of said layer of electrical insulator material.

12. An arrangement according to claim 11, wherein said layer of electrical insulator material comprises Mylar.

13. An arrangement according to claim 2, wherein said electric energy is a radio frequency signal.

14. An arrangement according to claim 6, wherein said sheet of conductive material is a sheet of conductive foil.

* * * * *